United States Patent

[11] 3,593,226

[72] Inventor Morton Weigel Bloomington, Ind.
[21] Appl. No 815,773
[22] Filed Apr. 14, 1969
[45] Patented July 13, 1971
[73] Assignee Sarkes Tarzian, Inc. Bloomington, Ind.

[54] COMBINED VHF-UHF TUNER

8 Claims, 6 Drawing Figs.

[52] U.S. Cl. 334/50, 325/461, 325/462, 325/465, 334/2
[51] Int. Cl. H03j 5/20
[50] Field of Search 325/458—465; 334/2, 49—51

[56] References Cited

UNITED STATES PATENTS

| | | | |
|---|---|---|---|
| 3,083,339 | 3/1963 | Bell | 325/461 X |
| 3,154,742 | 10/1964 | Bell | 325/461 X |
| 3,210,700 | 10/1965 | Krepps et al. | 334/50 |
| 3,249,902 | 5/1966 | Warthan et al | 334/50 |
| 3,365,621 | 1/1968 | Von Fange et al. | 334/50 X |

*Primary Examiner*—Herman Karl Saalbach
*Assistant Examiner*—Saxfield Chatmon, Jr.
*Attorney*—Mason, Kolehmainen, Rathburn and Wyss

ABSTRACT: A combination VHF-UHF tuner is provided in which the common VHF-UHF station selector shaft is detented in 24 positions. Alternate ones of these positions are employed in VHF reception and the other intermediate positions are employed for UHF reception of different UHF stations within predetermined groups of UHF stations. A 12-position detent wheel is employed in conjunction with a pair of follower arms arranged so that 24 detent positions are provided by alternate engagement of the arms in the notches of the detent wheel. Movement of one of the arms is used to actuate a 40 megacycle tuning stick so that it is operatively connected into the VHF portion of the tuner in each of the UHF positions.

INVENTOR:
MORTON L. WEIGEL

By Mason, Kolehmainen, Rathburn & Wyss
Attorneys

INVENTOR:
MORTON L. WEIGEL
By Mason, Kolehmainen, Rathburn & Wyss
Attorneys

COMBINED VHF-UHF TUNER

The present invention relates to television tuners, and, more particularly, to a television tuner arrangement for receiving both VHF television signals and UHF television signals from any one of the VHF or UHF television stations in a given area of reception.

Over the past several years there have been many arrangements proposed for combining the reception of both VHF and UHF television signals in a common tuner. One such arrangement is shown in a copending application of Morton L. Weigel, Ser. No. 507,341 filed Nov. 12, 1965, which is assigned to the same assignee as the present invention. In this copending Weigel application a common station selector shaft is employed to select both VHF and UHF channels, this selector shaft having 24 positions, in 12 positions of which the 12 VHF stations are selected and in the other 12 positions up to 12 UHF stations broadcasting in that particular reception area can be selected. Memory type fine tuning is also provided for both the VHF channels and the selected UHF channels in said Weigel application and fine tuning is accomplished by means of a common fine tuning knob so that insofar as the external controls of the tuner are concerned, the combined VHF-UHF tuner is identical to the conventional VHF tuner as regards selection of either a VHF station or a UHF station.

In the arrangement disclosed in said copending Weigel application, the VHF tuner portion is operated as an amplifier for the intermediate frequency output of the UHF tuner portion during UHF reception. In order to accomplish this function, the VHF tuner portion must be tuned to operate as an amplifier at the UHF intermediate frequency which is conventionally 40 megacycles. Furthermore, the VHF tuner portion must be tuned to operate as a 40-megacycle amplifier in each of the 12 UHF positions of the common station selector shaft. However, it is desirable from the standpoint of economy to use only one set of 40-megacycle tuning coils. In this copending Weigel application, several arrangements are provided for using only one set of 40-megacycle tuning coils and, while these arrangements are satisfactory for their intended purpose, they suffer from certain disadvantages.

It is, therefore, an important object of the present invention to provide a new and improved combination VHF-UHF television tuner in which the VHF portion of the tuner may be readily tuned to operate as a 40-megacycle amplifier in a number of different UHF positions of the common selector shaft of the tuner.

It is another object of the present invention to provide a new and improved combination VHF-UHF tuner wherein the 40-megacycle coils for operation of the VHF tuner portion as an amplifier, are mounted independently of the main VHF turret and are moved into operative engagement with the VHF stator contacts in each one of a number of UHF positions of the common selector shaft of the tuner.

It is still another object of the present invention to provide a new and improved combination VHF-UHF television tuner wherein a unique form of detent mechanism is employed to establish 24 positions for the common station selector shaft of the tuner and the detent mechanism is employed to control movement of a set of 40-megacycle tuning coils in such manner that these coils are operatively connected to the VHF tuner portion in alternate ones of the established 24 positions.

Briefly, in accordance with one aspect of the invention, the common station selector shaft of the tuner has secured thereto an index wheel having 12 notches equally spaced around the periphery thereof. A pair of pivotally mounted members each provided with a roller are positioned so that the rollers thereof are alternately seated in the notches of the index wheel as the selector shaft is rotated. When the roller of one pivotally mounted member is seated in a notch, the roller of the other member is positioned on the point separating two notches. Accordingly, the selector shaft is detented in 24 equally spaced positions, although the index wheel which provides these detents has only 12 notches. The stator contacts of the VHF portion of the tuner are arranged to establish connection to different VHF tuning sticks in alternate ones of the 24 positions but are completely disconnected from these tuning sticks in the 12 intermediate positions which are used for UHF reception. In these intermediate positions a group of 40-megacycle tuning coils, which are mounted independently of the VHF turret itself, are moved into engagement with the stator contacts under the control of the detent mechanism. Accordingly, in these intermediate positions, the VHF tuner portion is operated as a 40-megacycle IF amplifier in a single, economical and reliable manner.

The invention, both as to its organization and method of operation, together with further objects and advantages thereof, will best be understood by reference to the following specification taken in connection with the accompanying drawings in which.

Figure 1:
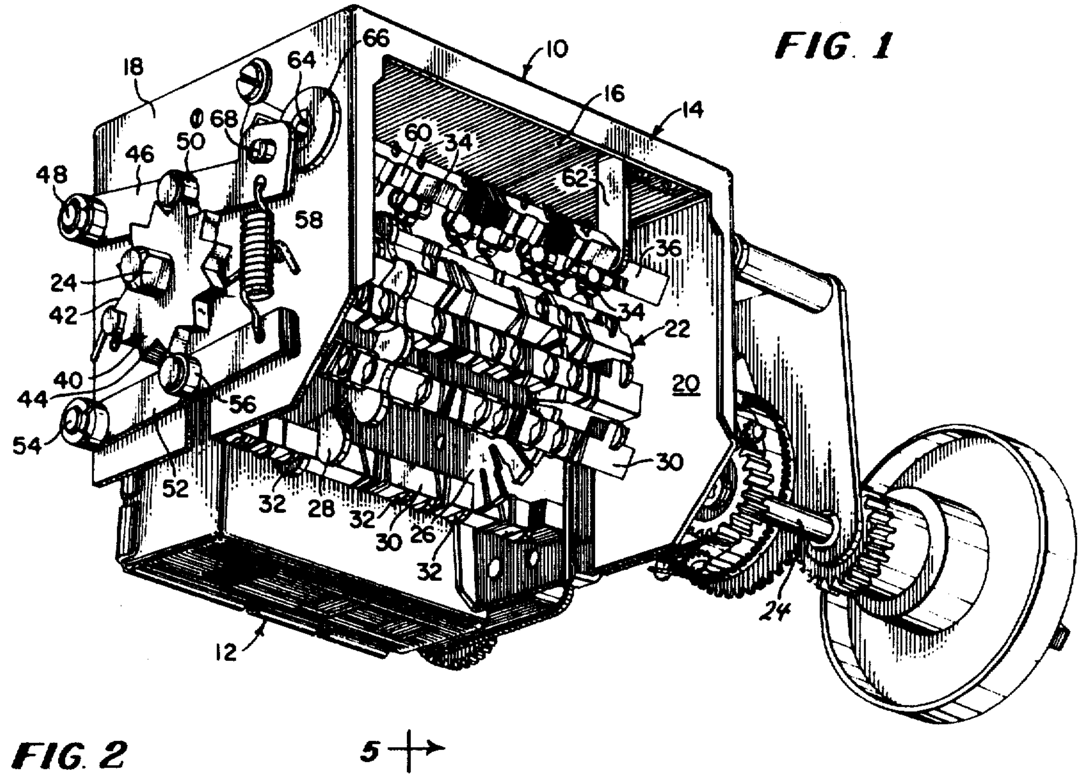
FIG. 1 is a perspective view of a combination VHF-UHF television tuner embodying the features of the present invention.
Figure 2:
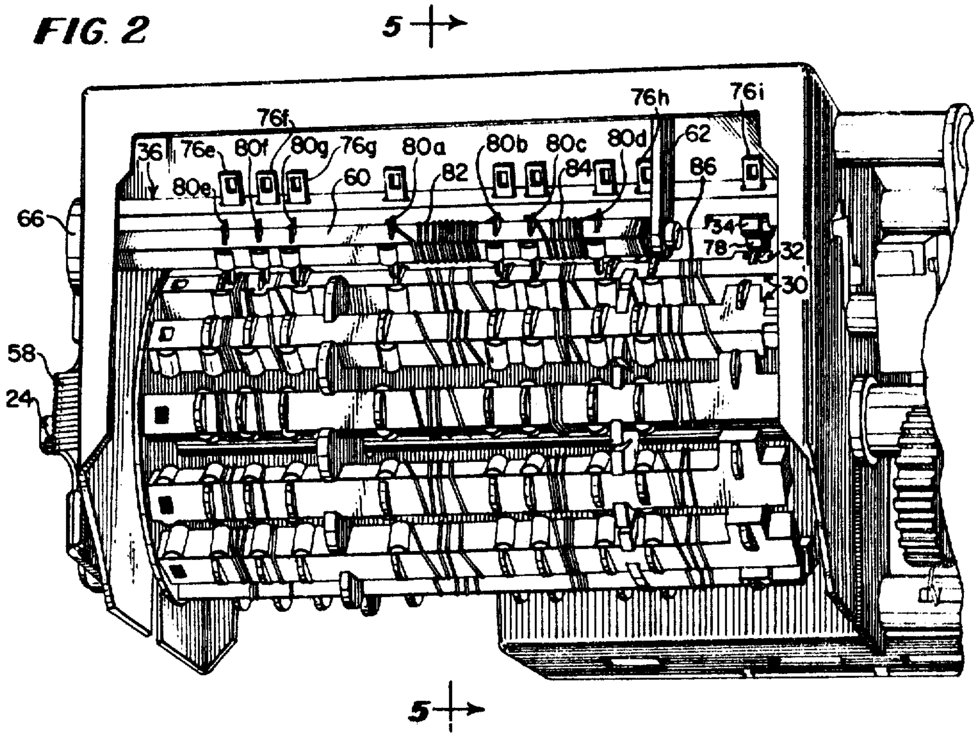
FIG. 2 is a further perspective view of the tuner of FIG. 1.

Referring now to the drawings, the combination VHF-UHF tuner is therein illustrated as comprising a VHF tuner portion indicated generally at 10 and a UHF tuner portion indicated generally at 12. The VHF tuner portion 10 comprises a chassis indicated at 14 and a removable U-shaped shield cover (not shown) is connected around the open portions of the chassis 14 to provide a shielded compartment within which is positioned a VHF turret structure indicated generally at 22 which is connected to the station selector or channel selector shaft 24 of the combination VHF-UHF tuner. The turret structure 22 includes a pair of transversely extending discs 26 and 28 which are arranged to support a number of elongated VHF tuning sticks 30. Specifically, a series of 12 VHF tuning sticks 30 are arranged at 30° intervals around the peripheries of the discs 26 and 28. These tuning sticks include a series of terminal members 32 which are arranged to make contact with corresponding stator contacts 34 on a fixed stator bar member 36 when the particular VHF tuning stick for the desired television station is rotated to the operative position by rotation of the selector shaft 24.

The present invention is concerned with an arrangement for adapting the VHF tuner portion 10 to operate as a UHF amplifier during UHF reception. Accordingly, any suitable electrical and mechanical arrangement can be employed to provide the conventional VHF fine tuning function and the conventional fine and coarse tuning for the UHF tuner portion 12. However, the present invention is specifically adapted to function in a combination VHF-UHF television tuner such as shown and described in a copending Weigel application Ser. No. 507,341 filed Nov. 12, 1965 and reference may be had to this copending application for a complete and detailed description of such a combination VHF-UHF tuner. Specifically, the present invention is concerned with an arrangement for adapting the VHF tuner portion 10 to amplify a 40-megacycle IF signal derived from the UHF tuner portion during UHF reception in each of the 12 alternate UHF reception positions of the common station selector shaft 24. Accordingly, the mechanical drive mechanism disclosed in the above-identified copending Weigel application for selecting a VHF station or a band of UHF stations and the mechanism associated with a concentric fine tuning shaft which acts as a memory fine tuning adjustment for both VHF and UHF stations, may be employed in the tuner 10, 12 insofar as the present invention is concerned. In the alternative, any other suitable drive mechanism may be employed for these concentric shafts. However, in the arrangement of the present invention the 24 position index wheel identified as 90 and the index lever identified as 94 in the above-identified copending Weigel application are replaced by an indexing mechanism which is positioned on the rear wall 18 of the VHF tuner portion 10. Also, the spring identified as 142 in the above-identified Weigel application is connected to a fixed point when the lever 94 is eliminated.

In the present arrangement an index wheel 40 is secured to the common station selector shaft 24 rearwardly of the rear wall 18 of the chassis 14, the index wheel 40 having a series of 12 notches 42 separated by 12 relatively sharp points 44. A first movable member 46 is pivotally mounted on a stud 48 which is mounted on the rear wall 18 and carries a roller 50 which is adapted to seat in one of the notches in the index wheel 40. A second movable member 52 is pivotally mounted on a post 54 also secured to the wall 18 and carries a roller 56 which is also adapted to seat in one of the notches 42 of the index wheel 40. However, the member 52 is so positioned on the wall 18 with respect to the member 50 that when the roller 50 is seated in one of the notches 42 the member 52 is held in an outer position by engagement of the roller 56 with one of the opposite points 44 of the index wheel 40. Accordingly, while only 12 notches 42 are provided in the index wheel 40, the selector shaft 24 is detented in 24 equally spaced positions since the rollers 50 and 56 are alternately seated in the notches 42. A coil spring 58 is connected between the outer ends of the members 46 and 52 and continuously urges the rollers 50 and 56 into engagement with the adjacent portions of the index wheel 40. Since one of the rollers 50, 56 moves out of a notch at the same time the other roller moves into a notch the torque requirements for either direction of rotation of the shaft 24 are substantially constant.

Figure 3:
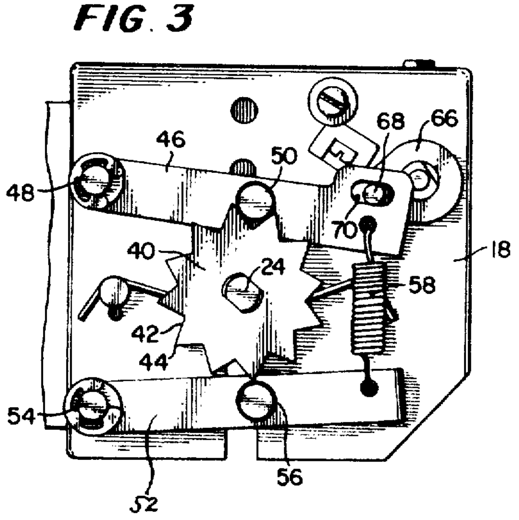
FIG. 3 is a rear view of the tuner of FIGS. 1 and 2.
Figure 5:
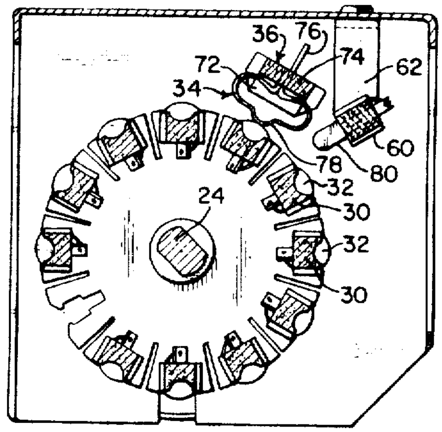
FIG. 5 is a sectional view taken along the lines 5–5 of FIG. 2.
Figure 4:
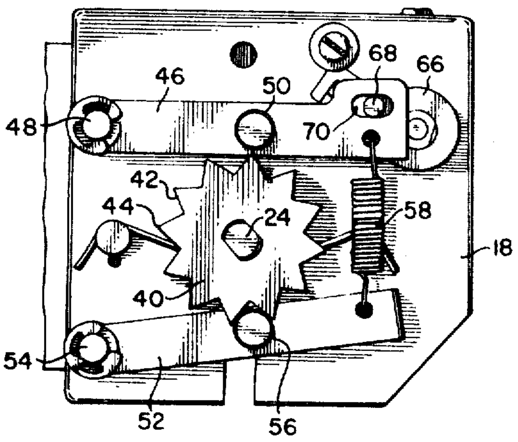
FIG. 4 is a view similar to FIG. 3 but showing the detent mechanism in a different position.

It will be noted that with the above-described index mechanism the member 46 occupies the position shown in FIG. 3 wherein the roller 50 is positioned in one of the notches 42, in the alternate VHF positions of the shaft 24 and occupies the position shown in FIG. 4, wherein the roller 50 is positioned on one of the points 44 of the index wheel 40, in the alternate UHF positions of the shaft 24. In accordance with an important feature of the present invention, this movement of the member 46 is employed to control the connection and disconnection of appropriate 40-megacycle tuning coils to the stator contacts 34 in the alternate UHF positions of the shaft 24 so that the VHF tuner portion 10 is operated as a 40-megacycle IF amplifier in each of the 12 alternate UHF positions and while employing only a single set of 40-megacycle tuning coils. More particularly, a relatively short 40-megacycle tuning stick 60 is rotatably mounted within the chassis 14 by means of a bracket 62 which is secured to the upper wall 16 of the chassis 14, one end of the tuning stick 60 being rotatably mounted in the bracket 62. The other end of the tuning stick 60 is rotatably mounted in the end wall 18 of the chassis 14 by means of a stud portion 64 which extends through the end wall 18. A plate 66 is secured to the stub 64 and is provided with an offset post 68 which is positioned within a slot 70 in the free end of the pivotally mounted member 46.

Figure 6:
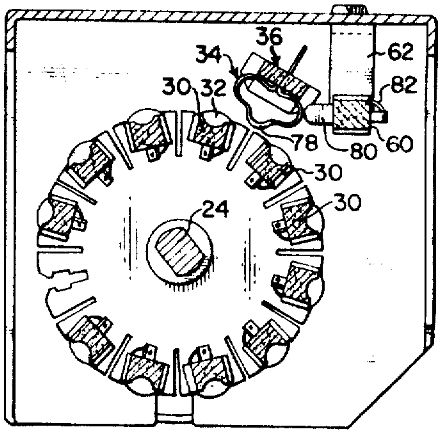
FIG. 6 is a view similar to FIG. 5 but showing the VHF turret in a UHF position of the common station selector shaft.

The stator bar 36 is provided with a number of slots 72 within which are positioned in the stator contacts 34. Each of the stator contacts 34 is in the form of a flat strip the ends of which are secured in the body 74 of the stator bar 34 and one end portion 76 extending from the back side of the body 74 so that connections to the other circuitry of the VHF tuner portion 10 can be readily made. The resilient loop portion of each stator contact 34 is provided with a protruding center portion 78 which is adapted to engage the contacts 32 on each of the VHF tuning sticks 30 in each of the 12 alternate VHF positions of the station selector shaft 24. However, in the alternate UHF positions of the shaft 24, i.e., the view shown in FIG. 6, the stator contacts 34 are completely disconnected from any of the VHF tuning sticks 30.

The 40-megacycle tuning stick 60 is provided with a number of terminals 80 spaced along the length of the stick 60 and extending transversely therethrough. Each of the terminals 80 is provided with a bifurcated end portion which is adapted to receive an end portion of one of the 40-megacycle coils which is wound around the stick. The stick 60 may carry any number of 40-megacycle tuning coils depending upon the requirements of the electrical circuitry of the VHF tuner portion 10. However, the terminals 80 on the tuning stick 60 must be spaced along the length of this stick in registration with the edge of the corresponding stator contacts 34. In the above-identified copending Weigel application, 40-megacycle tuning coils identified as the coils 304 and 316 in said application were permanently connected to the circuitry of the tuner and these coils were effective in the alternate UHF position to tune the associated circuits of the VHF portion to 40 megacycles. Also, in said application the tuning coils on the VHF tuning sticks were connected in shunt with the permanently connected 40-megacycle coils during VHF reception and functional to retune the circuits to the desired VHF station.

In the arrangement of the present invention, no such permanently connected 40-megacycle coils are connected to the stator 36. Instead, the 40-megacycle coils on the stick 60 are mechanically switched into engagement with the stator bar contacts 34 in each of the alternate 12 UHF positions of the shaft 24. A suitable interstage coupling network may be permanently connected between the RF stage and the mixer stage of the VHF portion 10, as described, for example, in Valdettaro U.S. Pat. Pat. No. 3,333,202 assigned to the same assignee as the present invention, which network will cooperate with either the VHF tuning sticks 30 for VHF reception or the tuning stick 60 for UHF reception.

In the illustrated embodiment the 40–megacycle tuning stick is shown as having two 40-megacycle tuning coils 82 and 84 which are wound about the stick 60, the ends of the coil 82 being connected to the terminals 80*a* and 80*b*, and the ends of the coil 84 being connected to the terminals 80*c* and 80*d*. These coils are switched into the VHF tuner circuitry so as to tune the output of the RF stage and the input of the mixer stage to 40 megacycles, as will be readily understood by those skilled in the art. In this connection it will be understood that the input to the RF amplifier stage need not be tuned to 40 megacycles by means of a coil on the stick 60 since the RF input is customarily switched from the VHF tuning sticks to a separate RF output circuit of the associated UHF tuner portion 12. Such an input switching arrangement is shown in the above-identified copending Weigel application wherein a switching member 420 is employed to connect the IF output circuit of the UHF tuner, which is tuned to 40 megacycles, to the input of the RF stage in the VHF tuner portion during UHF reception. Accordingly, in the present invention, the 40-megacycle tuning stick 60 is not provided with coils between the terminals 80*e*, 80*f* and 80*g*, thereof, which correspond to the RF input stator contacts 76*e*, 76*f* and 76*g*, respectively. In fact, the terminals 80*e*, 80*f* and 80*g* may be eliminated from the tuning stick 60 if desired. However, in the event that a 40-megacycle input circuit is required in the alternate UHF positions, appropriate coils would be included between the terminals 80*e*, 80*f* and 80*g* so that these tuning coils would also be automatically switched into the RF input circuit of the VHF tuner portion in each alternate UHF position, as will be readily understood by those skilled in the art.

Since no oscillator tuning coil is required when the VHF tuner portion is operated as a 40-megacycle amplifier, the tuning stick 60 may be shorter than the stator bar 36 since no provision on the tuning stick 60 need be made for terminals corresponding to the stator contacts 76*h* and 76*i* which connect to the VHF oscillator tuning coils 86 on each of the VHF tuning sticks 30.

In the arrangement of the present invention a switching arrangement for supplying B plus potential to the UHF tuner portion 12 in the alternate UHF positions is also required. Such an arrangement may comprise, for example, an auxiliary stator bar, identified as 400 in the above-identified copending Weigel application, which may be provided with a pair of stator contacts which are so positioned that they will establish contact with the terminal portions of one of the inactive VHF tuning sticks 30 when the selector shaft 24 is in any one of the UHF positions. Appropriate connections are made to this auxiliary stator bar so that a B plus potential may be supplied through one of the coils on the selected inactive one of the VHF tuning sticks to the UHF tuning portion 12, in each of the alternate UHF positions of the station selector shaft 24. For a complete and detailed description of such an auxiliary stator bar arrangement, reference may be had the above-identified copending Weigel application.

In the event that the combination VHF-UHF tuner of the present invention is to be controlled by a remote control arrangement, a suitable remote control drive motor and associated control circuit may be assembled to the rear end of the selector shaft 24, as described in detail in the above-identified copending Weigel application. With such an arrangement a bidirectional motor may be employed for remote selection of any one of the twelve VHF channels or any one of the twelve UHF stations to which the combination tuner has been preset, as described in detail in said copending Weigel application.

While but a single embodiment of the present invention has been here specifically disclosed, it will be apparent that many variations may be made therein, all within the true spirit and scope of the invention.

What I claim as new and is desired to be secured by Letters Patent of the United States is:

1. In a television tuner arrangement for receiving signals in both VHF and UHF television bands, a combined VHF and UHF television station selector shaft, means carried by said selector shaft for supporting a plurality of VHF tuning bars positioned parallel to said selector shaft and spaced radially therefrom, each of said VHF tuning bars including first tuning coils connected between different pairs of terminals extending radially outwardly from said selector shaft, a stator member having a number of contacts adapted to engage the terminals on different ones of said VHF tuning bars as said selector shaft is rotated, a UHF tuning bar including second tuning coils connected to terminals thereon, said UHF tuning bar being supported independently of said VHF tuning bar support means, detent means for establishing a plurality of different positions for said selector shaft in certain ones of which positions said stator contacts engage terminals of different ones of said VHF tuning bars, said stator contacts being disconnected from all of said VHF tuning bars in other ones of said positions, and means for moving the terminals of said UHF tuning bar into engagement with said stator contacts in at least certain of said different positions in which positions said VHF tuning bars are disconnected therefrom.

2. The combination of claim 1, wherein said terminals of said UHF tuning bar are moved into engagement with said stator contacts under the control of said detent means.

3. The combination of claim 1, wherein said detent means comprises an index wheel connected to said selector shaft and having 12 notches in the periphery thereof, a pair of pivotally mounted members each having detent means adapted to seat in one of the notches of said index wheel, said pivotally mounted members being positioned with respect to said index wheel so that said detent means alternately seat in a notch in said index wheel as said selector shaft is rotated, thereby providing 24 detented positions of said station selector shaft.

4. The combination as set forth in claim 3, wherein movement of one of said pivotally mounted members is employed to control engagement of said UHF tuning bar terminals with said stator contacts.

5. The combination as set forth in claim 3, wherein said UHF tuning bar is mounted for movement from a first position in which the terminals thereof do not engage said stator contacts to a second position in which the terminals thereof do engage said stator contacts, and means controlled by movement of one of said pivotally mounted members as said selector shaft is rotated for moving said UHF tuning bar from said first position to said second position.

6. The combination as set forth in claim 3, wherein said UHF tuning bar is mounted for movement from a first position in which the terminals thereof do not engage said stator contacts to a second position in which the terminals thereof do engage said stator contacts, and means interconnecting one of said pivotally mounted members and said UHF tuning bar in such manner that said UHF tuning bar is positioned in said first position when one of said VHF tuning bars is in engagement with said stator contacts and is positioned in said second position in intermediate detent positions of said selector shaft.

7. The combination of claim 1, wherein said detent means comprises an index wheel connected to said selector shaft and having 12 equally spaced notches in the periphery thereof, a pair of pivotally mounted members each having a roller thereon adapted to seat in one of the notches of said index wheel, said pivotally mounted members being positioned with respect to said index wheel so that the roller of one member seats in one of said notches when the roller of the other member engages the periphery of said index wheel intermediate said notches, whereby said rollers alternately seat in a notch in said index wheel as said selector shaft is rotated to provide 24 detented positions of said selector shaft.

8. The combination of claim 7, wherein said pivotally mounted members are biased to maintain said rollers in the notches of said index wheel by means of a spring connected between the outer ends of said members.